US006727644B2

(12) United States Patent
Hatwar et al.

(10) Patent No.: US 6,727,644 B2
(45) Date of Patent: Apr. 27, 2004

(54) ORGANIC LIGHT-EMITTING DEVICE HAVING A COLOR-NEUTRAL DOPANT IN AN EMISSION LAYER AND IN A HOLE AND/OR ELECTRON TRANSPORT SUBLAYER

(75) Inventors: Tukaram K. Hatwar, Penfield, NY (US); Ralph H. Young, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 111 days.

(21) Appl. No.: 09/923,024

(22) Filed: Aug. 6, 2001

(65) Prior Publication Data

US 2003/0071565 A1 Apr. 17, 2003

(51) Int. Cl.$^7$ ................................................ H01J 1/62
(52) U.S. Cl. ....................................... 313/504; 313/506
(58) Field of Search .................................. 313/504, 506

(56) References Cited

U.S. PATENT DOCUMENTS

| | | | |
|---|---|---|---|
| 4,539,507 A | | 9/1985 | VanSkyke et al. |
| 4,769,292 A | | 9/1988 | Tang et al. |
| 4,885,211 A | | 12/1989 | Tang et al. |
| 5,593,788 A | | 1/1997 | Shi et al. |
| 5,601,903 A | * | 2/1997 | Fujii et al. .................. 428/212 |
| 5,645,948 A | | 7/1997 | Shi et al. |
| 5,776,622 A | | 7/1998 | Hung et al. |
| 5,853,905 A | | 12/1998 | So et al. |
| 5,928,802 A | * | 7/1999 | Shi et al. .................... 428/690 |
| 5,989,737 A | | 11/1999 | Xie et al. |
| 6,020,078 A | | 2/2000 | Chen et al. |
| 6,127,004 A | | 10/2000 | Hatwar et al. |
| 6,208,075 B1 | | 3/2001 | Hung et al. |
| 6,210,814 B1 | * | 4/2001 | Thompson et al. .......... 428/690 |
| 6,361,886 B2 | * | 3/2002 | Shi et al. .................... 428/690 |
| 6,387,546 B1 | * | 5/2002 | Hamada et al. ............. 428/690 |
| 6,420,031 B1 | * | 7/2002 | Parthasarathy et al. .. 428/411.1 |
| 2002/0127427 A1 | * | 9/2002 | Young et al. ............... 428/690 |

FOREIGN PATENT DOCUMENTS

EP        0 961 330    12/1999
JP        11-273861    10/1999

OTHER PUBLICATIONS

"Transparent Organic Light Emitting Devices" by G. Gu et al., Applied Physics Letter 68, May 6, 1996, pp. 2606–2608.
"Highly Phosphorescent Bis–Cyclometalated Iridium Complexes: Synthesis, Photophysical Characterization, and Use in Organic Light Emitting Diodes", by Sergey Lamansky et al., J. Am. Chem. Soc. 2001, 123, pp. 4304–4312.
"Interface Engineering in Preparation of Organic Surface–Emitting Diodes" by L. S. Hung et al., Applied Physics Letters, vol. 74, No. 21, May 24, 1999, pp. 3209–3211.
"Effects of Anthracene Doping on Electrical and LightEmitting Behavior of 8–Hydroxyquinoline–AluminumBased Electroluminescent Devices" by Manabu Takeuchi et al., Jpn. J. Appl. Phys. vol. 31 (1992) pp. L498–L500.
"Improved Energy Transfer in Electrophosphorescent Devices" by D. F. O'Brien et al., Applied Physics Letters, vol. 74, No. 3, Jan. 18, 1999, pp. 442–444.
"Improving the Efficiency and Stability of Organic Light-Emitting Devices by Using Mixed Emitting Layers" by Zoran Popovic et al., SPIE Conference Proceedings, vol. 3476, Jul. 1998, pp. 68–73.

* cited by examiner

Primary Examiner—Ashok Patel
Assistant Examiner—Glenn D. Zimmerman
(74) Attorney, Agent, or Firm—Raymond L. Owens

(57) ABSTRACT

Disclosed are organic electroluminescent devices comprising a substrate, an anode and a cathode disposed over the substrate, an emission layer (EML) disposed between the anode and the cathode, a hole-transport layer (HTL) disposed between the anode and the emission layer, and an electron-transport layer (ETL) disposed between the cathode and the emission layer. The EML and either the HTL, the ETL, or both the HTL and the ETL include a derivative of anthracene as a color-neutral dopant. A color-neutral dopant is a dopant whose presence does not alter the electroluminescent color of the device.

28 Claims, 11 Drawing Sheets

(6 of 11 Drawing Sheet(s) Filed in Color)

ORGANIC LIGHT-EMITTING DEVICE HAVING A COLOR-NEUTRAL DOPANT IN AN EMISSION LAYER AND IN A HOLE AND/OR ELECTRON TRANSPORT SUBLAYER

CROSS REFERENCE TO RELATED APPLICATIONS

Reference is made to commonly assigned U.S. patent application Ser. No. 09/875,646 filed Jun. 6, 2001 entitled "Organic Light-Emitting Device Having a Color-Neutral Dopant in a Hole-Transport Layer and/or in an Electron-Transport Layer", by Tukaram K. Hatwar and Ralph H. Young, the disclosure of which is incorporated herein.

FIELD OF THE INVENTION

The present invention relates to organic electroluminescent devices and more particularly to doping an emission layer and a hole-transport layer and/or an electron-transport layer with suitable color-neutral dopants to improve the operational lifetime of these devices without affecting the electroluminescent color.

BACKGROUND OF THE INVENTION

A common form of organic electroluminescent device (OLED) includes a substrate and, disposed thereupon, a multilayer structure comprising an anode, an optional hole-injection layer, a hole-transport layer, an emission layer, an optional electron-transport layer, and a cathode, each layer of the multilayer structure comprising one or more organic or organometallic compounds. Electroluminescent (EL) devices are attractive because of their low driving voltage, high luminance, wide viewing angle, and capability for full-color flat-panel emissive displays. Tang et al. described this OLED structure in their U.S. Pat. Nos. 4,769,292 and 4,885,211. With the prospect of using OLED in display screens for laptop computers, digital personal organizers, cellular telephones etc., it is highly desirable to improve the operational lifetime of these devices.

The following patents and publications disclose the preparation of OLED with improved operational lifetime. Modifications of the multilayer structure, stabilized cathode materials, and confinement of various carriers and their recombination within the emission zone have achieved significant improvement in the operational lifetime of these devices. So et al., in U.S. Pat. No. 5,853,905, discussed an EL device consisting of a single organic emission layer containing a mixture of electron-transport and hole-transport materials, sandwiched between anode and cathode. However, this device has low efficiency. Popovic et al., in SPIE Conference Proceedings, Vol. 3476, pp. 68–72, 1998, described an EL device with improved efficiency and operational lifetime prepared by mixing an emitting electron-transport material and a hole-transport material in a light-emitting layer. Xie et al., in U.S. Pat. No. 5,989,737, disclosed an OLED in which the hole-transport layer comprises a tertiary aromatic amine doped with a polycyclic aromatic hydrocarbon such as rubrene. This approach has the problem that some dopants, such as rubrene, alter the electroluminescent color of the device.

The color of the EL emission can be altered by employing a binary mixture of materials in the emission layer. The major component of the mixture, known as the host material, is responsible for transport of electrical current, and the minor component, known as the dopant, is responsible for the EL emission. For this use, the dopant is usually a luminescent dye, and the color of the emission is characteristic of the dopant. A dopant can also be used to increase the EL efficiency without substantially changing the EL color. Takeuchi et al., Jpn. Journal of Applied Physics, Vol. 31, Part 2, No. 4B, pp. L 498–L500, 1992 and Japanese Patent# JP11273861-A disclose the use of anthracene as such a dopant and tris(8-quinolinolato-N1,O8)aluminum, also known as 8-hydroxyquinoline aluminum, as the host.

SUMMARY OF THE INVENTION

It is therefore an object of the present invention to provide an organic light-emitting device comprising:
 a) a substrate;
 b) an anode and a cathode positioned relative to the substrate;
 c) an emission layer disposed between the anode and the cathode;
 d) a hole-transport layer disposed between the anode and the emission layer;
 e) an electron-transport layer disposed between the cathode and the emission layer;
 f) the hole-transport layer including one or more sublayers, the sublayer closest to the emission layer containing a color-neutral dopant;
 g) the emission layer containing a color neutral dopant; and
 h) the color-neutral dopant including an anthracene derivative.

A color-neutral dopant is a dopant that does not substantially affect the electroluminescent color of the device relative to that of an otherwise identical device from which the dopant is omitted.

ADVANTAGES

The use of a color-neutral dopant permits the electroluminescent color of the present OLEDs to be tuned solely by adjusting the composition of the emission layer. It has been found that certain anthracene derivatives can be used as color-neutral dopants in the emission layer and in the hole-transport and/or the electron-transport layer of an OLED and that the resulting device has a greater operational lifetime than an otherwise identical device that does not contain the color-neutral dopant.

Other features and advantages of the present invention include the following:

OLEDs with various electroluminescent colors, such as red, green, blue, or white, can be constructed by inclusion of suitable luminescent dopants in the emission layer. Thereby, it is possible to construct OLEDs with simultaneously optimized lifetime and chromaticity.

OLEDs of this invention have high luminance efficiency.

OLEDs of this invention can be used with a low-voltage current source.

Inclusion of a color-neutral dopant in the emission layer and simultaneously in the hole-transport layer and/or the electron-transport layer provides an OLED with an operational lifetime greater than that of an OLED including the color-neutral dopants in only the hole-transport layer and/or the electron-transport layer but not the emission layer.

The devices made in accordance with the present invention have long operational lifetimes and excellent luminance properties.

BRIEF DESCRIPTION OF THE DRAWINGS

The patent or application file contains at least one drawing executed in color. Copies of this patent or patent application publication with color drawing(s) will be provided by the office upon request and payment of the necessary fee.

The drawings in FIGS. 1–5 are necessarily of a schematic nature, since the individual layers are too thin and thickness differences of the various elements too great to permit depiction to scale or to permit convenient proportionate scaling.

DETAILED DESCRIPTION OF THE INVENTION

The emission layer of an OLED comprises an organic or organometallic material that produces light, known as electroluminescence, as a result of electron-hole recombination in the layer. Hereinafter, the term organic will be taken to include both purely organic and organometallic materials. In the simplest construction of the prior art, shown in FIG. 1, an emission layer 140 is sandwiched between an anode 120 and a cathode 150. The emission layer can be a single pure material with a high luminescent efficiency. A well-known material for this purpose is tris(8-quinolinolato-N1,O8)aluminum (Alq), which produces excellent green electroluminescence. The emission layer can also contain lesser amounts of other materials, hereinafter termed luminescent dopants, whose function is to alter the EL efficiency or the color of the emitted light. A substrate 110 provides mechanical support for the OLED and for electrical leads connecting the OLED to a source of electrical current. Layers 110 through 150 together comprise the OLED 100. The cathode, or both the anode and the substrate, are transparent to the electroluminescent light, allowing that light to be viewed. The term transparent refers to the ability to transmit no less than 80 percent of the electroluminescent light. In a variant of this structure, the cathode, rather than the anode, rests upon the substrate. In that variant, either the anode, or both the cathode and the support, are transparent to the electroluminescent light. When the cathode and anode are connected to a source of electrical current (not shown), holes are injected from the anode and electrons are injected from the cathode, and they recombine in the emission layer to produce electroluminescent light.

Figure 1:
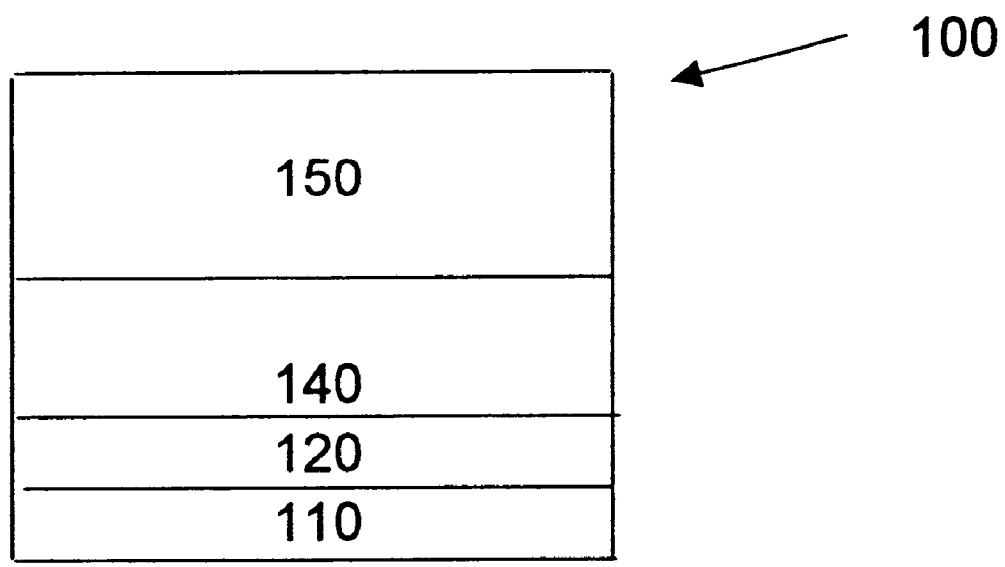
FIG. 1 depicts an OLED of the prior art.
Figure 2:
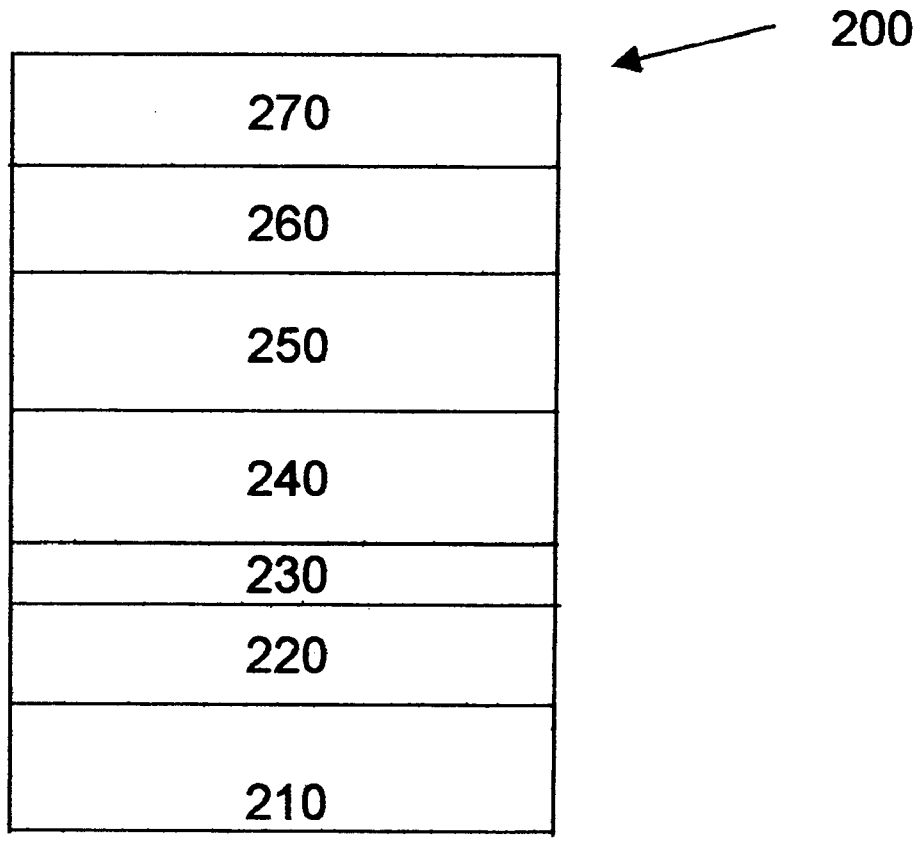
FIG. 2 depicts another OLED of the prior art.

In a more elaborate structure of the prior art, shown in FIG. 2, an emission layer 250 is situated between a hole-transport layer (HTL) 240 and an electron-transport layer (ETL) 260. Each of these layers is composed predominantly of organic materials. The two transport layers deliver holes from an anode 220 and electrons from a cathode 270, respectively, to the emission layer. An optional hole-injection layer (HIL) 230 facilitates the injection of holes from the anode to the hole-transport layer. The emission layer functions as the primary site for electron-hole recombination and emission of the resulting electroluminescent light. In this respect, the functions of the individual organic layers are distinct and can therefore be optimized independently. Thus, the emission layer can be optimized for a desirable EL color and a high luminance efficiency. The emission layer can also contain lesser amounts of luminescent dopants whose function is to alter the EL efficiency or the color of the emitted light. Likewise, the hole- and electron-transport layers can be optimized for their charge-transport properties. A substrate 210 provides mechanical support for the OLED and for electrical leads connecting the OLED to a source of electrical current. Layers 210 through 270 together comprise the OLED 200. Either the cathode, or both the anode and the substrate, are transparent to the electroluminescent light. In a variant of this structure, the cathode, rather than the anode, rests upon the substrate. In that variant, either the anode, or both the cathode and the support, are transparent to the electroluminescent light. In another variant of this structure, the emission layer and the electron-transport layer can be combined to form a single layer that performs the functions of both. In yet another variant of this structure, an additional hole-injection layer can be inserted between the anode and the hole-transport layer. A function of this additional layer is to facilitate the injection of holes into the hole-transport layer. Similarly, it is possible for the hole-transport layer to comprise at least two sublayers of different compositions, chosen to optimize separately the charge-injecting interface at the anode and the current-carrying properties of the remainder of the hole-transport layer.

When an electrical potential difference (not shown) is applied between the anode 220 and the cathode 270, the cathode injects electrons into the electron-transport layer 260, and they migrate across that layer to the emission layer (EML) 250. At the same time, holes are injected from the anode 220 into the hole-transport layer 240, and they migrate across that layer to the emission layer. The holes and electrons recombine in the emission layer 250, frequently near the junction between the hole-transport layer and the emission layer. Part of the energy released by the recombination process is emitted as electroluminescence, which escapes through the transparent anode or cathode and/or the substrate.

Figure 3:
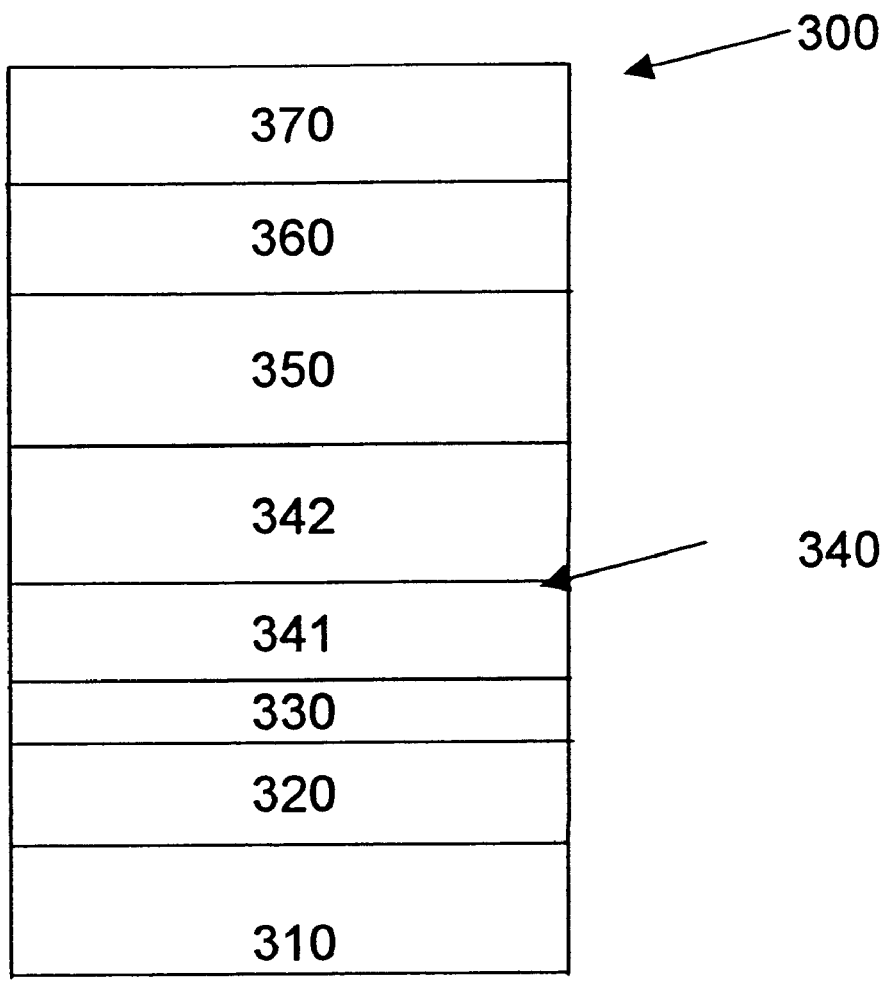
FIG. 3 depicts an OLED according to the present invention.

FIG. 3 depicts an OLED of the present invention. This OLED 300 is similar to the OLED of the prior art 200 shown in FIG. 2, except that both the hole-transport layer (HTL) 340 and the emission layer (EML) 350 contain a color-neutral dopant of the present invention. The hole-transport layer 340 may optionally be subdivided into two or more sublayers, illustrated in FIG. 3 as sublayers 341 and 342. Additional components include the substrate 310, anode 320, optional hole-injection layer 330, electron-transport layer (ETL) 360, and cathode 370. Further subdivision of the layers or sublayers into sublayers with varying composition is within the scope of this invention, provided that the sublayer of the hole-transport layer that is adjacent to the emission layer contains a color-neutral dopant of this invention. It is also possible for the cathode, rather than the anode, to reside on the substrate. The electrical functions and optical requirements are the same as for the OLED of the prior art shown in FIG. 2.

Figure 4:
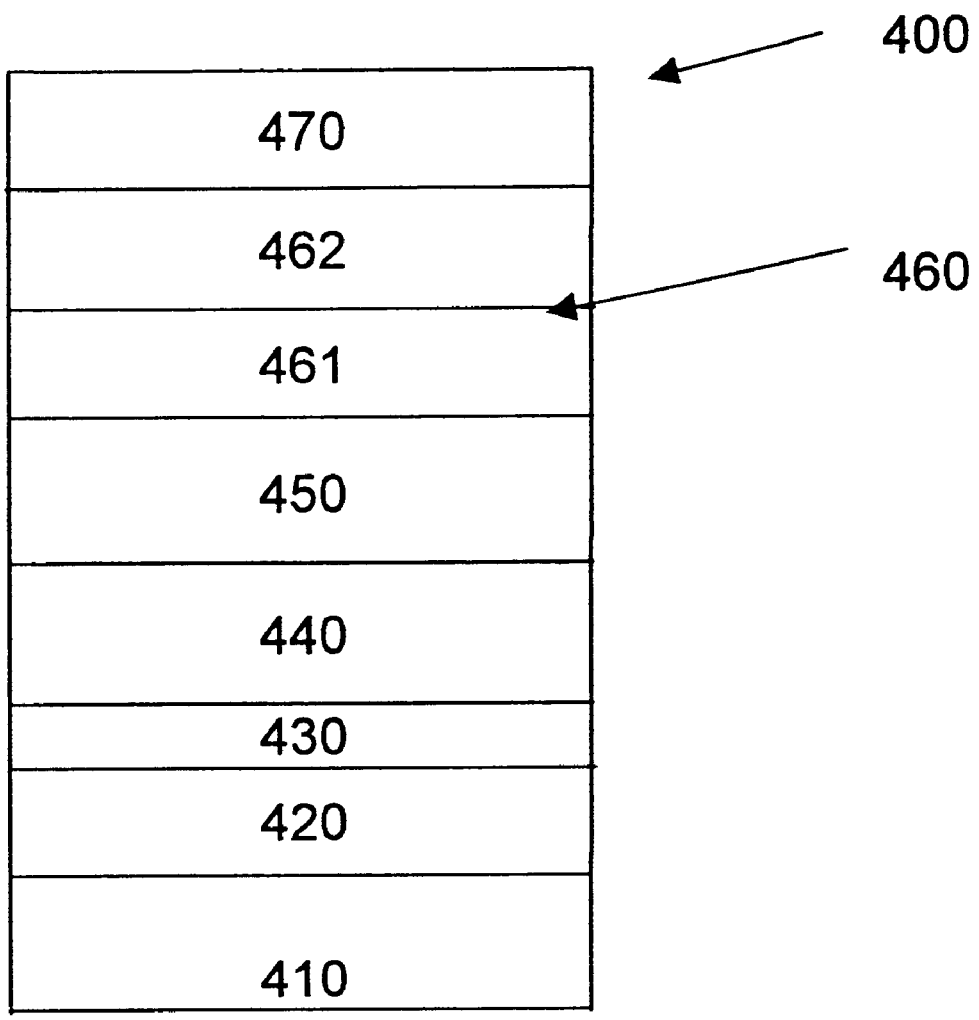
FIG. 4 depicts another OLED according to the present invention.

FIG. 4 depicts another OLED of the present invention. This OLED 400 is similar to the OLED of the prior art 200 except that the emission layer 450 and the electron-transport layer 460 are both doped with a color-neutral dopant of the present invention. The electron-transport layer 460 may optionally be subdivided into two or more sublayers, illustrated in FIG. 4 as sublayers 461 and 462. Additional components include the substrate 410, anode 420, optional hole-injection layer 430, hole-transport layer 440, and cathode 470. Further subdivision of the layers or sublayers is within the scope of this invention, provided that the sublayer of the electron-transport layer that is adjacent to the emission layer contains a color-neutral dopant of this invention. It is also possible for the cathode, rather than the anode, to reside on the substrate. The electrical functions and optical requirements are the same as for the OLED of the prior art shown in FIG. 2.

Figure 5:
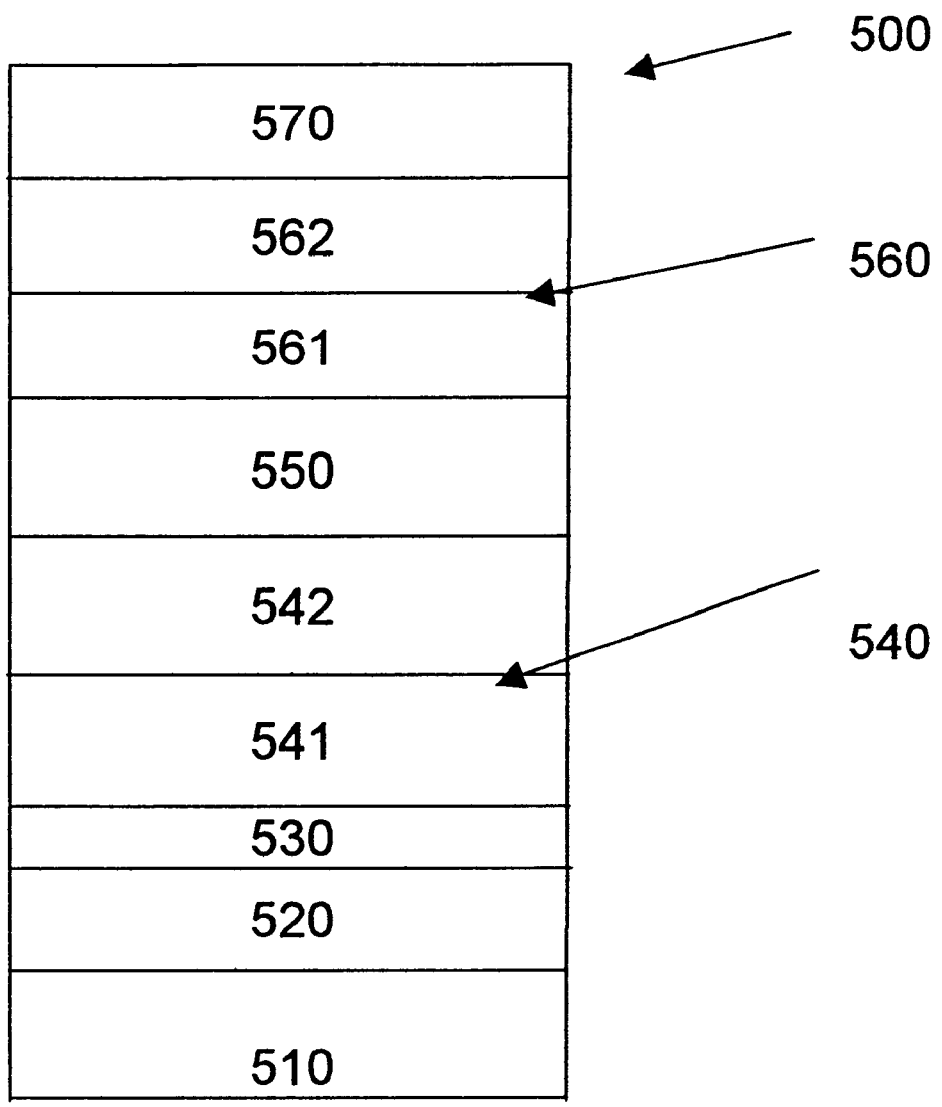
FIG. 5 depicts yet another OLED according to the present invention.

FIG. 5 depicts yet another OLED of the present invention. This OLED 500 is similar to OLED 200 of the prior art but includes the inventive features of both OLEDs 300 and 400. The hole-transport layer 540, emission layer 550, and electron-transport layer 560 are each doped with a color-neutral dopant of the present invention. The same or different color-neutral dopants can be used in each layer. The hole-transport layer 540 may optionally be subdivided into two or more sublayers, illustrated in FIG. 5 as sublayers 541 and 542. The electron-transport layer 560 may optionally be subdivided into two or more sublayers, illustrated in FIG. 5 as sublayers 561 and 562. Additional components include the substrate 510, anode 520, optional hole-injection layer 530, and cathode 570. Further subdivision of the layers or sublayers is within the scope of this invention, provided that the sublayers of the hole- and electron-transport layers that are adjacent to the emission layer each contain a color-neutral dopant of this invention. It is also possible for the cathode, rather than the anode, to reside on the substrate. The electrical functions and optical requirements are the same as for the OLED of the prior art shown in FIG. 2.

The substrate of an OLED can be constructed of glass, quartz, or a plastic material and can, optionally, incorporate additional layers serving additional functions such as color-filter layers to remove unwanted spectral components from the electroluminescent light.

An OLED can be viewed as a diode, which is forward biased when the anode is at a higher electrical potential than the cathode. The anode and cathode of the OLED can each take any convenient conventional form, such as any of the various forms disclosed by Tang et al. U.S. Pat. No. 4,885,211. The operating voltage can be substantially reduced by use of a low-work-function cathode and a high-work-function anode.

For most purposes, the preferred cathodes are those constructed of a combination of a metal having a work function less than 4.0 eV and one at least one other metal. The Mg:Ag alloy of Tang et al., U.S. Pat. No. 4,885,211, constitutes one preferred cathode material. Hung et al., in U.S. Pat. No. 5,776,622, have disclosed the use of a LiF|Al bilayer to enhance electron injection in OLEDs. This and similar bilayers can be used as cathodes in the present invention. In some cases, it is desirable to fabricate an OLED using an opaque support such as a silicon substrate. In such cases, it is preferred to use a cathode material that is transparent in the range of wavelengths emitted by the OLED, as described in publications by Gu et al., Applied Physics Letters, vol. 68, 2606 (1996) and Hung et al., Applied Physics Letters, vol. 74, 3209 (1999).

Conventional anodes are formed of a conductive and transparent metal oxide. Indium tin oxide (ITO) has been widely used as the anode material because of its transparency, good conductivity, and high work function. It is the preferred anode material in the present invention.

In a preferred embodiment, a hole-injection layer is disposed between the anode and the hole-transport layer. A preferred material in such a hole injection layer is a fluorocarbon ($CF_x$) such as those disclosed in commonly assigned U.S. Pat. Nos. 6,208,075 and 6,127,004.

A preferred embodiment of the emission layer comprises a host material capable of transporting both electrons and holes and doped with a relatively small amount of one or more luminescent dopants, as described by Tang et al. in U.S. Pat. No. 4,769,292. Conventional host materials for the emission layer include metal complexes with the 8-hydroxyquinolate anion, also known as metal-chelated oxinoid compounds, and metal complexes with derivatives of 8-hydroxyquinolate. Examples include tris(8-quinolinolato-N1,O8)aluminum (Alq), tris(8-quinolinolato-N1,O8)gallium (Gaq), bis(8-quinolinolato-N1,O8) magnesium (Mgq), bis(8-quinolinolato-N1,O8)zinc (Znq), and the like. Most preferred among these complexes is Alq. Other materials may be used as host material in the emission layer.

The choice of host material for the emission layer depends, in part, on the desired emission color and/or the choice of any luminescent dopant to be used in that layer. Host materials comprising metal complexes with derivatives of 8-hydroxyquinolate, such as Alq, are useful when dyes of the coumarin or quinacridone class are used as luminescent dopants for green emission or derivatives DCM are used as luminescent dopants for red emission. A preferred green-emitting coumarin is C545 T as described by Tang et al. in U.S. Pat. No. 6,020,078. A preferred green-emitting quinacridone is CFDMQA as described by Shi et al. in U.S. Pat. No. 5, 593,788. A preferred red-emitting dye, which is a derivative of DCM, is DCJTB. The structures of DCM and DCJTB are shown below.

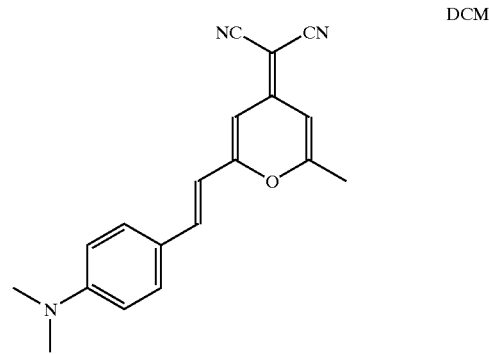

DCM

-continued

DCJTB

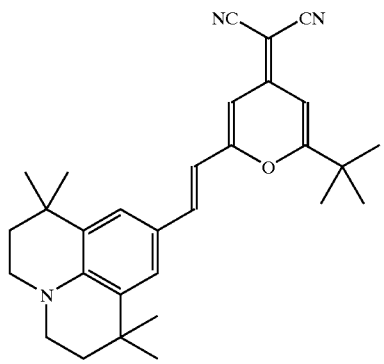

Other materials can be used as luminescent dopants, including phosphorescent compounds such as the platinum complex described by O'Brien et al., Applied Physics Letters, Vol. 74, pp. 442–444, 1999 or the iridium compounds described by Lamansky et al., Journal of the American Chemical Society, Vol. 123, pp. 4304–4312, 2001. The quantity of a luminescent dopant in an emission layer is usually between 0.01 and 10% and preferably between 0.5 and 2%. Hereinafter, the percentage of a luminescent dopant or a color-neutral dopant in a composition means a percentage by volume with respect to the total composition.

Materials useful in the electron-transport layer of this invention include metal complexes with the 8-hydroxyquinolate anion, such as those described above, as disclosed in U.S. Pat. No. 4,885,211. Such materials both exhibit high levels of performance and are readily fabricated in thin layers. They can be used as the sole material of an undoped electron-transport layer or an undoped sublayer of an electron-transport layer. They can also be used as the host material in a doped electron-transport layer or a doped sublayer of an electron-transport layer. Materials of this class are currently preferred. Most preferred is Alq. Other materials known in the art can be used in the electron-transport layer of this invention. An example is TPBI, described in U.S. Pat. No. 5,645,948 by Shi et al. If a transparent cathode is used, it is preferred to use materials in the electron-transport layer that are also transparent.

Materials useful in the hole-transport layer of this invention include tertiary amines as taught in Van Slyke in U.S. Pat. No. 4,539,507. They can be used as the sole material of an undoped hole-transport layer or an undoped sublayer of a hole-transport layer. They can also be used as the host material in a doped hole-transport layer or a doped sublayer of a hole-transport layer. Materials of this class are currently preferred. Most preferred is NPB, namely 4,4'-Bis[N-(1-napthyl)-N-phenylamino]biphenyl as described by Van Slyke et al. in U.S. Pat. No. 4,539,507.

A color-neutral dopant is a dopant that does not substantially affect the electroluminescent color of the device relative to that of an otherwise identical device from which the dopant is omitted. A dopant can be color-neutral if, when used in an OLED, it does not luminesce. It can fail to luminesce because the lifetimes of its excited states are too short for radiation to occur with any substantial probability, either because of the intrinsic nature of the dopant or as a consequence of its environment inside the OLED. It can fail to luminesce if, when raised to an excited energy level, it transfers its energy to another component of the OLED. In this case, for the dopant to be color-neutral, any transfer of energy to a component of the OLED that is luminescent must result in luminescence of the same color as that of the OLED without the color-neutral dopant. A color-neutral dopant can fail to luminesce if, in the normal functioning of the OLED, the dopant is rarely raised to an excited energy level. A dopant can be color-neutral if, when used in an OLED, the color of any luminescence from the dopant is the same as that of an otherwise similar OLED from which the dopant is omitted.

The color-neutral dopants useful in the present invention are substituted anthracene compounds. The substituents can be alkyl, substituted alkyl, aryl, substituted aryl, halo, cyano, alkoxy, or the like. Preferred among these are compounds whose intrinsic luminescence is in the blue region of the spectrum. Preferred color-neutral dopants are anthracene derivatives substituted with aryl or substituted aryl groups at the 9 and 10 positions as conventionally designated. Examples are 9,10-diphenylanthracene, 9,10-bis[4-(2,2-diphenylethenyl)phenyl]anthracene, ADN, and TBADN. The structures of ADN and TBADN are shown below.

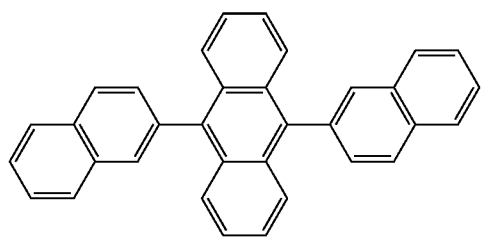

ADN

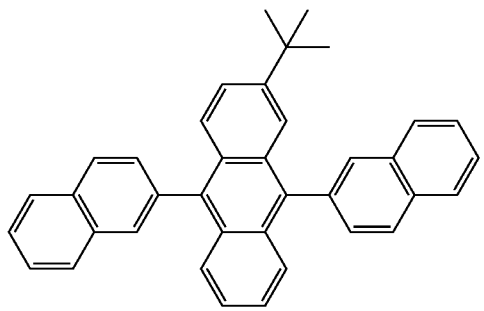

TBADN

Currently preferred as color-neutral dopants are ADN and TBADN. When used as a color-neutral dopant any layer or sublayer, the anthracene compounds comprise between 0.1 and 25% of the doped layer or sublayer and preferably between 1 and 15%.

The thickness of the hole-transport layer is between 20 and about 200 nm and preferably between 70 and 150 nm. The thickness of the emission layer is between 20 and about 100 nm and preferably between 20 and 75 nm. The thickness of the electron-transport layer is between 20 and about 100 nm and preferably between 20 and 75 nm. When the hole-transport layer includes a sublayer containing a color-neutral dopant and disposed adjacent to the emission layer (sublayer 342 in FIG. 3 or sublayer 542 in FIG. 5), the thickness of the sublayer is between 2 and about 200 nm and preferably between 10 and 100 nm. When the hole-transport layer includes a sublayer lacking a color-neutral dopant and disposed adjacent to the anode or to the optional hole-injection layer (sublayer 341 in FIG. 3 or sublayer 541 in FIG. 5), the thickness of the sublayer is between 2 and about 200 nm and preferably between 10 and 100 nm. Similarly, when the electron-transport layer includes a sublayer containing a color-neutral dopant and disposed adjacent to the emission layer (sublayer 461 in FIG. 4 or sublayer 561 in FIG. 5), the thickness of the sublayer is between 2 and 50 nm and preferably between 10 and 35 nm. When the electron-transport layer includes a sublayer lacking a color-neutral dopant and disposed adjacent to the cathode (sublayer 462 in FIG. 4 or sublayer 562 in FIG. 5), the thickness of the sublayer is between 2 and 50 nm and preferably between 20 and 40 nm. The thickness of the cathode layer is between 20 and 200 nm and preferably between 50 and 200 nm.

Devices of the structure shown in FIG. 5, containing a color-neutral dopant of the present invention in the hole-transport layer, the emission layer, and the electron-transport layer, have significantly greater operational lifetimes than devices containing the same color-neutral dopant in the hole-transport layer and the electron-transport layer but not in the emission layer.

A useful method for constructing OLED of the present invention includes vapor deposition in a vacuum chamber. This method permits the organic layers and the metal cathode to be deposited sequentially upon the anode without significant interference or mixing of the layers. The thickness of each individual layer and its composition can be precisely controlled in the deposition process. To produce the desired composition of each layer, the rate of deposition for each component is independently controlled using a deposition rate monitor.

EXAMPLES

The invention and its advantages are further illustrated by the specific examples that follow. As indicated above, in describing the concentration of a dopant, any percentage refers to percentage by volume of the dopant with respect to the total material in the layer.

Comparative Example 1

An OLED of the prior art, with the structure shown in FIG. 2, was constructed in the following manner. A glass substrate (210) coated with an 80 nm layer of ITO for use as an anode (220) was sequentially ultrasonicated in a commercial detergent, rinsed in deionized water, and degreased in toluene vapor. The ITO layer was treated with an oxygen plasma for about one minute and then coated with 1 nm of a fluorocarbon layer by plasma assisted deposition of $CHF_3$ to produce a $CF_x$ hole-injection layer (HIL, 230). The resulting coated substrate was transferred to a vacuum chamber. There, the following additional layers were deposited in sequence over the hole-injection layer by vacuum vapor deposition: 150 nm of NPB as the hole-transport layer (HTL, 240), 37.5 nm of undoped Alq as the emission layer (EML, 250), 37.5 nm of undoped Alq as the electron-transport layer (ETL, 260), and 200 nm of a MgAg alloy (in the ratio 90:10%, 270). The above sequence completed the construction of the OLED. The OLED was transferred to a glove box filled with dry nitrogen, where it was enclosed along with a desiccant in a hermetically-sealed package for protection against the ambient environment.

The ITO coating on the glass substrate was patterned so that several OLEDs were produced on one substrate. The EL characteristics of one of these OLEDs were evaluated using a constant-current source and a photometer. The initial luminance efficiency, CIE coordinates, and driving voltage, all at a current density of 20 mA/cm$^2$, are shown in Table I. The operational stability of this OLED was evaluated by operating it at a constant current density of 20 mA/cm$^2$ while monitoring its luminance and driving voltage. The luminance and driving voltage, relative to their initial values, are shown as functions of operating time in FIGS. 6 and 7, respectively. The EL characteristics and operational stability of additional OLEDs described below were evaluated at the same current density and in the same manner as in this Example.

Comparative Example 2

Figure 6:
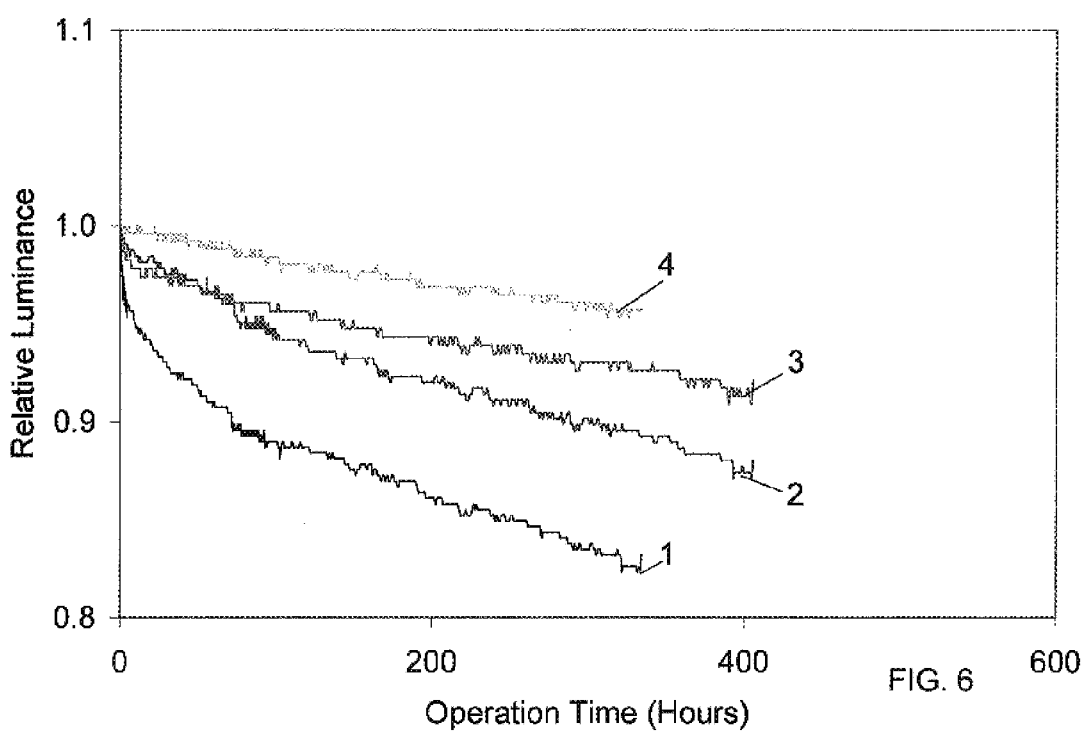
FIG. 6 is a graph showing the luminance as a function of operation time, relative to the initial luminance, for green emitting OLEDs of one composition according to the present invention.
Figure 7:
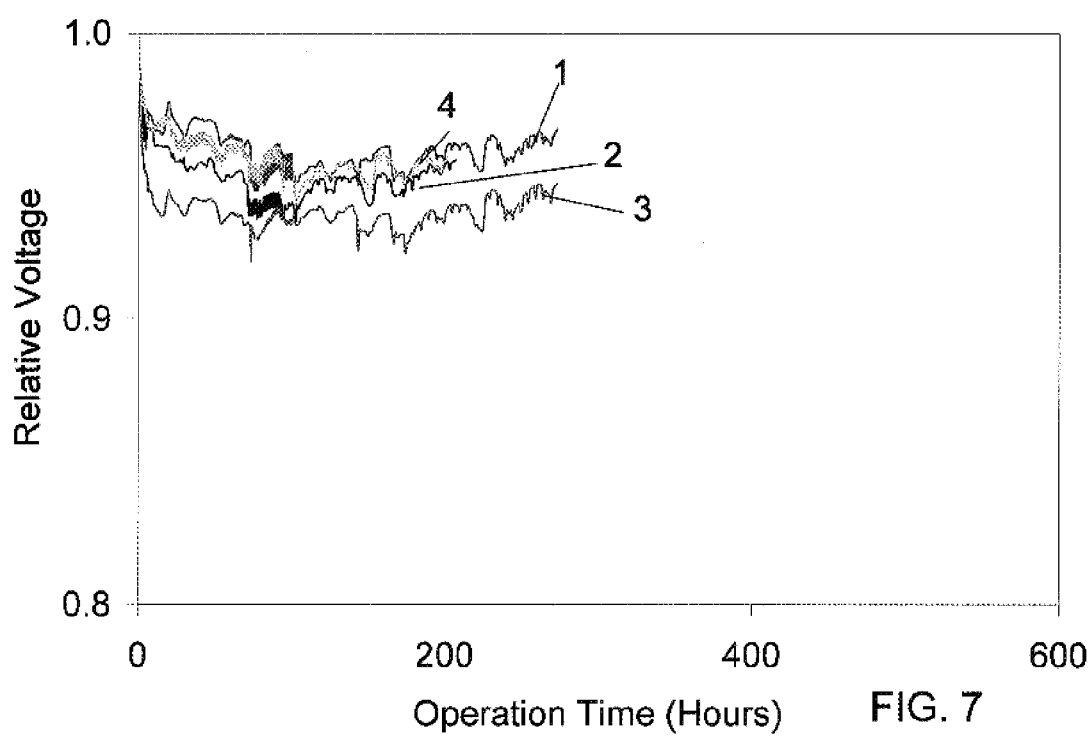
FIG. 7 is a graph showing the driving voltage as a function of operation time, relative to the initial driving voltage, for the OLEDs used to produce the data in FIG. 6.

Another OLED was constructed with the structure shown in FIG. 2. The EML (250) consisted of 37.5 nm of Alq doped with ADN as a color-neutral dopant, the ADN comprising 5% of the layer. In all other regards, the structure and construction of this device were the same as for the OLED of Comparative Example 1. The initial luminance efficiency, CIE coordinates, and driving voltage are also shown in Table I. The relative luminance and driving voltage as functions of operating time are also shown in FIGS. 6 and 7, respectively.

Comparative Example 3

An OLED was constructed with the structure shown in FIG. 2. The HTL (240) consisted of a 120 nm sublayer of undoped NPB adjacent to the HIL and a 30 nm sublayer of NPB doped with ADN adjacent to the EML, the ADN being present as a color-neutral dopant and comprising 5% of the sublayer. In all other regards, the structure and construction of this device were the same as for the OLED of Comparative Example 1. The initial luminance efficiency, CIE coordinates, and driving voltage are also shown in Table I. The relative luminance and driving voltage as functions of operating time are also shown in FIGS. 6 and 7, respectively.

Example 4

An OLED of the present invention was constructed with the structure shown in FIG. 3. The EML (350) consisted of 37.5 nm of Alq doped with ADN as a color-neutral dopant, the ADN comprising 5% of the Alq. In all other regards, the structure and construction of this device were the same as for the OLED of Comparative Example 3. The initial luminance efficiency, CIE coordinates, and driving voltage are also shown in Table I. The relative luminance and driving voltage as functions of operating time are also shown in FIGS. 6 and 7, respectively.

TABLE I

Composition and EL properties of the OLEDs of Example 1–4

| Example | Color-neutral dopant in | | | Luminance yield (cd/A) | CIEx | CIEy | Driving voltage (V) |
| --- | --- | --- | --- | --- | --- | --- | --- |
| | HTL | EML | ETL | | | | |
| 1 | | | | 2.4 | 0.34 | 0.54 | 8.1 |
| 2 | | ✓ | | 2.3 | 0.34 | 0.54 | 8.2 |
| 3 | ✓ | | | 2.5 | 0.34 | 0.54 | 8.2 |
| 4 | ✓ | ✓ | | 2.3 | 0.34 | 0.54 | 8.3 |

In Columns 2, 3, and 4, a check mark (✓) indicates presence of a color-neutral dopant in the HTL, EML, or ETL, respectively. Columns 5–8 refer to initial performance at a current density of 20 mA/cm$^2$.

In FIGS. 6 and 7, the numerals to the right of the traces identify them with the corresponding Examples. The data in FIG. 6 show that the decrease in luminance during extended operation is much more gradual for the OLED of Example 4, than for OLEDs of comparative Examples 1–3. The OLED of Example 4 incorporates the inventive feature that both the hole-transport layer and the emission layer contain a color-neutral dopant. The OLEDs of the Comparative Examples lack this feature. Thus, the OLED of the present invention has greatly improved operational stability with respect to luminance relative to OLEDs that lack the inventive feature.

As shown in FIG. 7, the driving voltages initially decrease by a few per cent, then rise very gradually. The overall variation in the driving voltage is small for the OLED of the present invention and the OLEDs of the Comparative Examples. Therefore, the improved operational stability with respect to the luminance is achieved without any significant loss of stability with respect to driving voltage. Therefore, OLEDs of the present invention possess far greater operational lifetimes than OLEDs lacking the inventive feature. The data in Table I show that the use of a color-neutral dopant according to the present invention does not affect the initial EL performance significantly. Thus, the improvements in operational lifetime are achieved without any significant adverse effect on other parameters of EL performance.

Comparative Example 5

An OLED of the prior art was constructed similarly to that of Comparative Example 1, except that the EML consisted of Alq doped with 0.5% CFDMQA as a luminescent dopant in order to produce green electroluminescence with improved luminance yield, and the ETL thickness was 35 nm. The initial luminance efficiency, CIE coordinates, and driving voltage are shown in Table II. The luminance and driving voltage, relative to their initial values, are shown as functions of operating time in FIGS. 8 and 9, respectively.

Comparative Example 6

Figure 8:
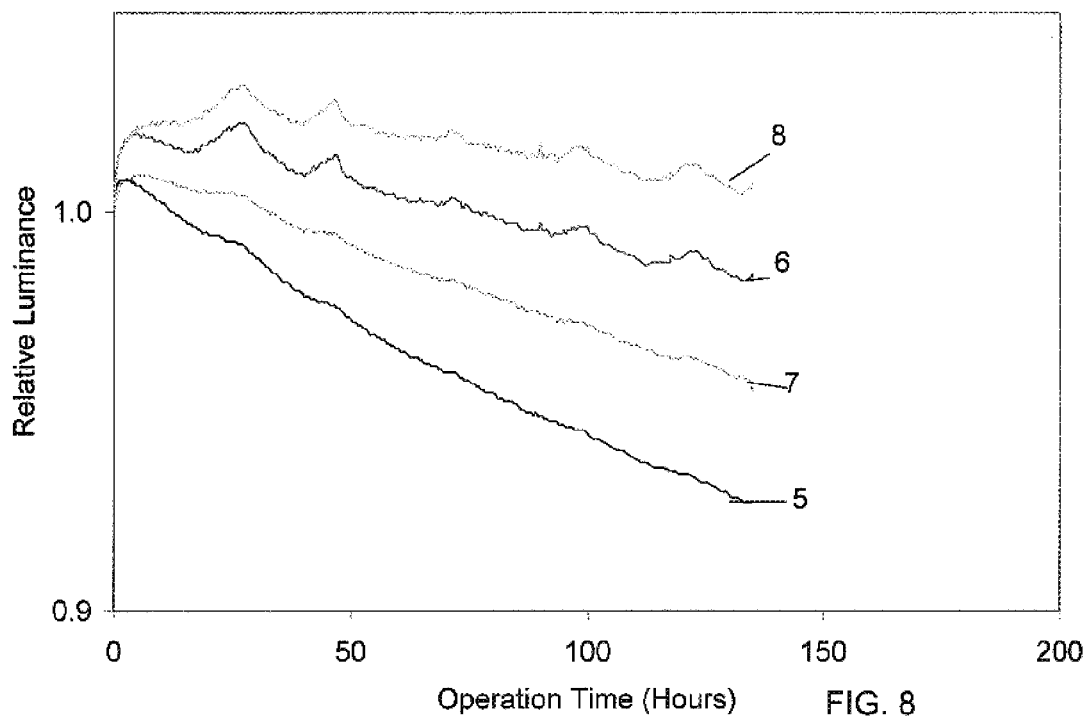
FIG. 8 is a graph showing the relative luminance as a function of operation time for green-emitting OLEDs of another composition according to the present invention.
Figure 9:
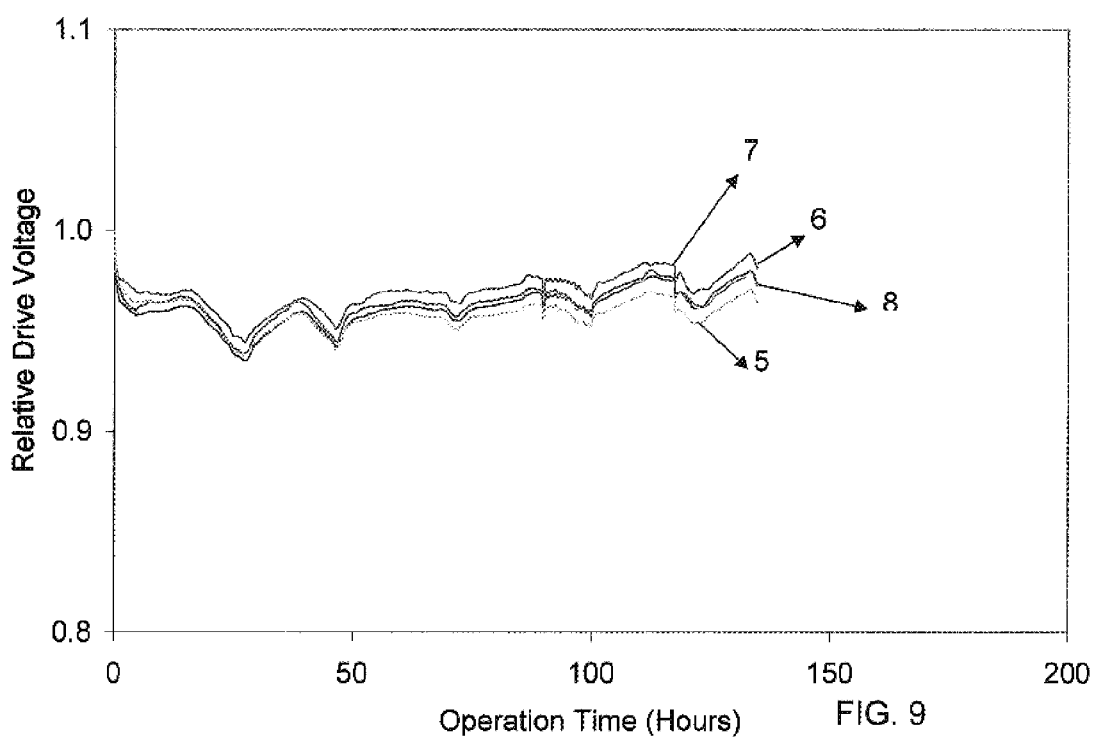
FIG. 9 is a graph showing the relative driving voltage as a function of operation time for the OLEDs used to produce the data in FIG. 8.

An OLED of the prior art was constructed similarly to that of Comparative Example 5, except that the EML (250) was doped with 0.5% CFDMQA as a luminescent dopant and 5% ADN as a color-neutral dopant. The initial luminance efficiency, CIE coordinates, and driving voltage are also shown in Table II. The relative luminance and driving voltage as functions of operating time are also shown in FIGS. 8 and 9, respectively.

Comparative Example 7

An OLED was constructed with the structure shown in FIG. 2. The HTL (240) consisted of a 120 nm sublayer of undoped NPB adjacent to the HIL and a 30 nm sublayer of NPB, doped with 5% ADN as a color-neutral dopant, adjacent to the EML. The ETL (260) consisted of a 20 nm sublayer of Alq, doped with 5% ADN as a color-neutral dopant, adjacent to the EML and a 15 nm sublayer of undoped Alq adjacent to the cathode. In all other regards, the structure and construction of this device were the same as for the OLED of Comparative Example 5. The initial luminance efficiency, CIE coordinates, and driving voltage are also shown in Table II. The relative luminance and driving voltage as functions of operating time are also shown in FIGS. 8 and 9, respectively.

Example 8

An OLED of the present invention was constructed with the structure shown in FIG. 5. The HTL (540) consisted of a 120 nm sublayer (541) of undoped NPB and a 30 nm sublayer (542) of NPB doped with 5% ADN as a color-neutral dopant. The EML (550) consisted of 35 nm of Alq doped with 0.5% CFDMQA as a luminescent dopant and 5% ADN as a color neutral dopant. The ETL (560) consisted of a 20 nm sublayer (561) of Alq doped with 5% ADN as a color-neutral dopant, and a 15 nm sublayer (562) of undoped Alq. Thus the color neutral dopant was present in the HTL, EML and ETL. In all other regards, the structure and construction of this device were the same as for the OLED of Comparative Example 5. The initial luminance efficiency, CIE coordinates, and driving voltage are also shown in Table II. The relative luminance and driving voltage as functions of operating time are also shown in FIGS. 8 and 9, respectively.

TABLE II

Composition and EL properties of the OLEDs of Examples 5–8

| Example | Color-neutral dopant in | | | Luminance yield (cd/A) | CIEx | CIEy | Driving voltage (V) |
| --- | --- | --- | --- | --- | --- | --- | --- |
| | HTL | EML | ETL | | | | |
| 5 | | | | 5.6 | 0.32 | 0.63 | 8.8 |
| 6 | | ✓ | | 5.2 | 0.31 | 0.63 | 8.6 |
| 7 | ✓ | | ✓ | 5.5 | 0.32 | 0.63 | 8.6 |
| 8 | ✓ | ✓ | ✓ | 5.3 | 0.31 | 0.63 | 8.8 |

In Columns 2, 3, and 4, a check mark (✓) indicates presence of a color-neutral dopant in the HTL, EML, or ETL, respectively. Columns 5–8 refer to initial performance at a current density of 20 mA/cm$^2$.

In FIGS. 8 and 9, the traces are identified with the corresponding Examples by the numerals to the right of the traces. The data in FIG. 8 show that the decrease in luminance during extended operation is much more gradual for the OLED of the present invention, Example 8, than for the OLEDs of Comparative Examples 5–7. The OLED of Example 8 incorporates the inventive feature that the hole-transport layer, the emission layer, and the electron-transport layer all contain a color-neutral dopant. The OLEDs of the Comparative Examples lack this feature. Thus, the OLED of the present invention has greatly improved operational stability with respect to luminance relative to OLEDs that lack the inventive feature.

As shown in FIG. 9, the driving voltages initially decrease by a small amount, approximately 2%, then rise very gradually. The overall variation in the driving voltage is small for both the OLED of the present invention and the OLEDs of the Comparative Examples. Therefore, the improved operational stability in terms of the luminance is achieved without any significant loss of stability with respect to driving voltage. Therefore, OLEDs of the present invention possess far greater operational lifetimes than OLEDs lacking the inventive feature. The data in Table II show that the use of a color-neutral dopant according to the present invention has, at most, a small effect on the luminance yield and no significant effect on the CIE coordinates or the driving voltage. Thus, the improvements in operational lifetime are achieved with little adverse effect on other parameters of EL performance.

Comparative Example 9

An OLED of the prior art was constructed similarly to that of Comparative Example 1 except that the ETL thickness was 35 nm. The initial luminance efficiency, CIE coordinates, and driving voltage are shown in Table III. The luminance and driving voltage, relative to their initial values, are shown as functions of operating time in FIGS. 10 and 11, respectively.

Example 10

An OLED of the present invention was constructed with the structure shown in FIG. 4. The EML (450) consisted of 37.5 nm of Alq doped with ADN as a color-neutral dopant.

Figure 10:
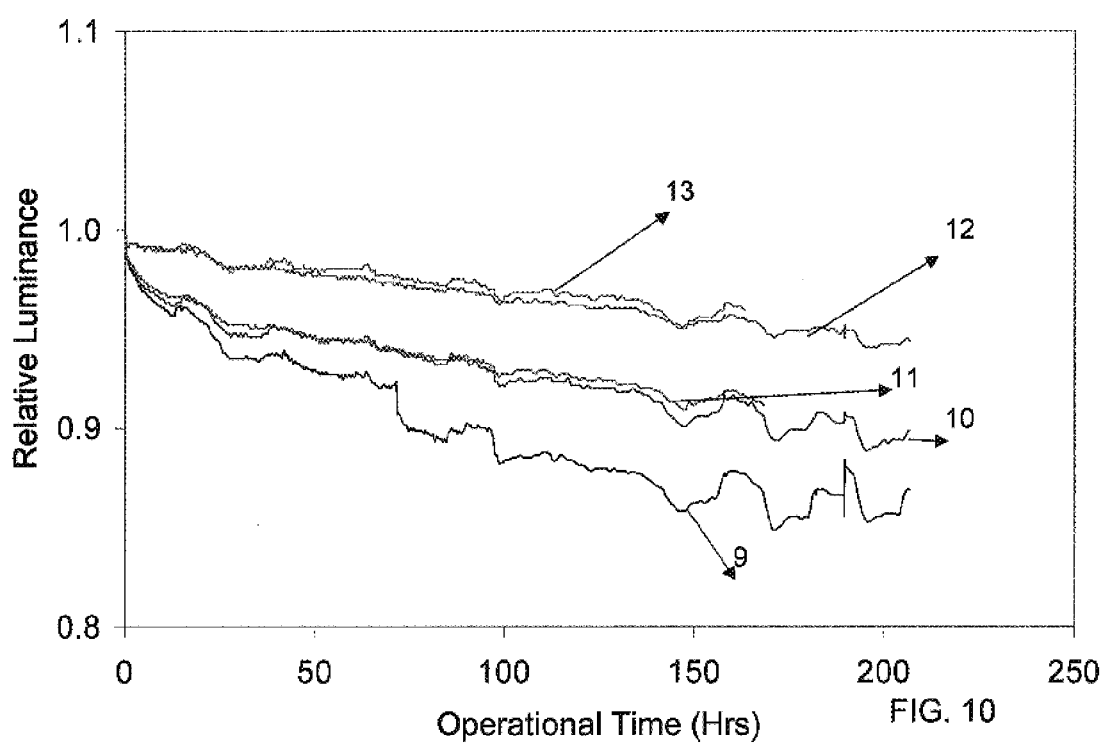
FIG. 10 is a graph showing the luminance as a function of operation time, relative to the initial luminance, for green emitting OLEDs of one composition according to the present invention.
Figure 11:
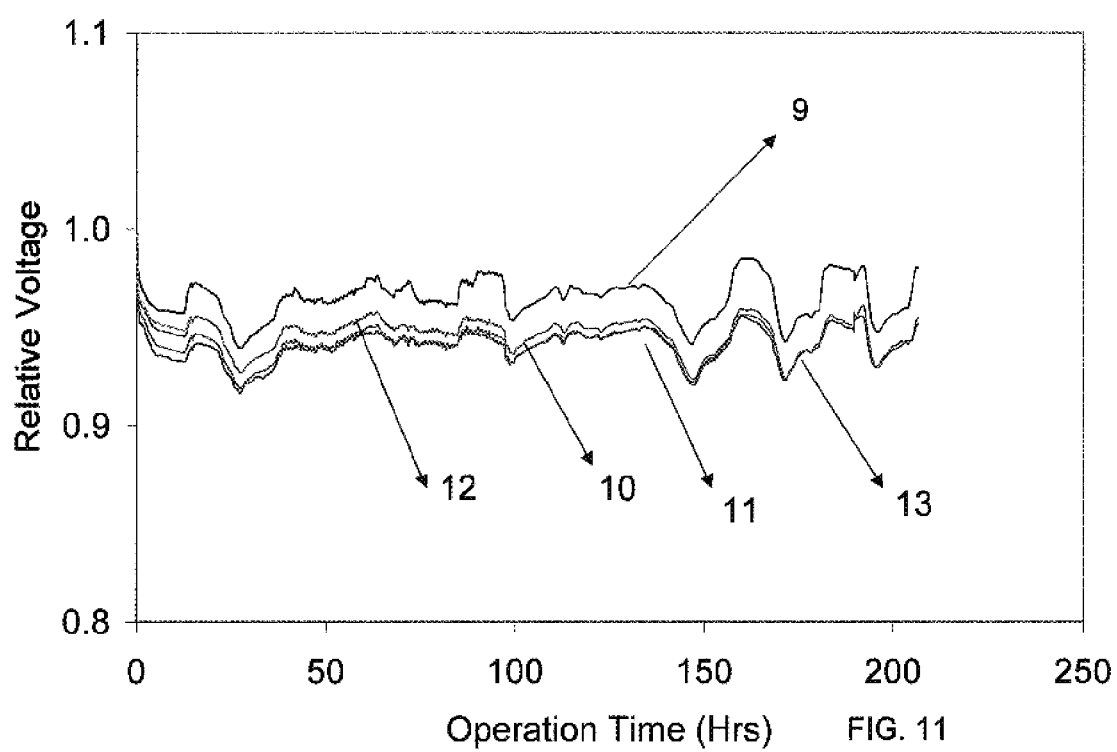
FIG. 11 is a graph showing the driving voltage as a function of operation time, relative to the initial driving voltage, for the OLEDs used to produce the data in FIG. 10.

The ETL (460) consisted of a 15 nm sublayer (462) of undoped Alq adjacent to the cathode (470) and a 20 nm sublayer (461) of Alq doped with ADN adjacent to the EML, the ADN being present as a color-neutral dopant. The ADN comprised 5% of the EML and 5% of sublayer 461 of the ETL. In all other regards, the structure and construction of this device were the same as for the OLED of Comparative Example 9. The initial luminance efficiency, CIE coordinates, and driving voltage are also shown in Table III. The relative luminance and driving voltage as functions of operating time are also shown in FIGS. 10 and 11, respectively.

Example 11

An OLED of the present invention was constructed similarly to that of Example 10, except that the ETL was a single layer of Alq doped with ADN as a color-neutral dopant, the ADN comprising 5% of the layer. The initial luminance efficiency, CIE coordinates, and driving voltage are also shown in Table III. The relative luminance and driving voltage as functions of operating time are also shown in FIGS. 10 and 11, respectively.

Example 12

An OLED of the present invention was constructed with the structure shown in FIG. 3. The HTL (340) consisted of a 120 nm sublayer (341) of undoped NPB adjacent to the HIL (330) and a 30 nm sublayer (342) of NPB doped with ADN as a color-neutral dopant adjacent to the EML (350), the ADN comprising 5% of the sublayer. The EML contained ADN as a color-neutral dopant, the ADN comprising 5% of the layer. In all other regards, the structure and construction of this device were the same as for Comparative Example 9. The initial luminance efficiency, CIE coordinates, and driving voltage are also shown in Table III. The relative luminance and driving voltage as functions of operating time are also shown in FIGS. 10 and 11, respectively.

Example 13

An OLED of the present invention was constructed with the structure shown in FIG. 5. The construction was the same as that of the OLED of Example 12, except that the ETL (560) consisted of a 15 nm sublayer (562) of undoped Alq adjacent to the cathode (570) and a 20 nm sublayer (561) of Alq doped with ADN as a color-neutral dopant adjacent to the EML (550), the ADN comprising 5% of the sublayer. The initial luminance efficiency, CIE coordinates, and driving voltage are also shown in Table III. The relative luminance and driving voltage as functions of operating time are also shown in FIGS. 10 and 11, respectively.

TABLE III

Composition and EL properties of the OLEDs of Example 9–13

| Example | Color-neutral dopant in HTL | Color-neutral dopant in EML | Color-neutral dopant in ETL | Luminance yield (cd/A) | CIEx | CIEy | Driving voltage (V) |
|---|---|---|---|---|---|---|---|
| 9 | | | | 2.3 | 0.35 | 0.53 | 7.2 |
| 10 | | ✓ | ✓ | 2.0 | 0.34 | 0.53 | 8.0 |
| 11 | | ✓ | ✓ | 2.0 | 0.35 | 0.54 | 8.2 |
| 12 | ✓ | ✓ | | 2.0 | 0.34 | 0.53 | 7.3 |
| 13 | ✓ | ✓ | ✓ | 2.1 | 0.34 | 0.54 | 7.8 |

In Columns 2, 3, and 4, a check mark (✓) indicates presence of a color-neutral dopant in the HTL, EML, or ETL, respectively. Columns 5–8 refer to initial performance at a current density of 20 mA/cm$^2$.

In FIGS. 10 and 11, the traces are identified with the corresponding Examples by the numerals used as labels. The data in FIG. 10 show that the decrease in luminance during extended operation is much more gradual for the OLEDS of the present invention, Examples 10–13, than for the OLED of Comparative Example 9. The OLEDs of Examples 10–13 incorporate the inventive feature that a color-neutral dopant is present in the emission layer and in the hole-transport layer and/or the electron-transport layer. The OLED of the Comparative Example lacks this feature. Thus, the OLEDs of the present invention have greatly improved operational stability with respect to luminance relative to OLEDs that lack the inventive feature.

As shown in FIG. 11, the driving voltages initially decrease by a small amount, approximately 5%, then remain approximately constant. The overall variation in the driving voltage is small for both the OLEDs of the present invention and the OLED of the Comparative Example. Therefore, the improved operational stability in terms of the luminance is achieved without any significant loss of stability with respect to driving voltage. Therefore, OLEDs of the present invention possess far greater operational lifetimes than OLEDs lacking the inventive feature. The data in Table III show that the use of a color-neutral dopant according to the present invention has, at most, a small effect on the luminance yield and the driving voltage and no significant effect on the CIE coordinates. Thus, the improvements in operational lifetime are achieved with little adverse effect on other parameters of EL performance.

The invention has been described in detail with particular reference to certain preferred embodiments thereof, but it will be understood that variations and modifications can be effected within the spirit and scope of the invention.

| PARTS LIST | |
|---|---|
| 100 | OLED with a simple structure |
| 110 | substrate |
| 120 | anode |
| 140 | emission layer |
| 150 | cathode |
| 200 | OLED with a multilayer structure |
| 210 | substrate |
| 220 | anode |
| 230 | hole-injection layer (HIL) |
| 240 | hole-transport layer (HTL) |
| 250 | emission layer (EML) |
| 260 | electron-transport layer (ETL) |
| 270 | cathode |
| 300 | OLED |
| 310 | substrate |
| 320 | anode |
| 330 | hole-injection layer (HIL) |
| 340 | hole-transport layer (HTL) |
| 341 | hole-transport sublayer 1 |
| 342 | hole-transport sublayer 2 |
| 350 | emission layer (EML) |
| 360 | electron-transport layer (ETL) |
| 370 | cathode |
| 400 | OLED |
| 410 | substrate |
| 420 | anode |
| 430 | hole-injection layer (HIL) |
| 440 | hole-transport layer (HTL) |
| 450 | emission layer (EML) |
| 460 | electron-transport layer (ETL) |
| 461 | electron-transport sublayer 1 |
| 462 | electron-transport sublayer 2 |
| 470 | cathode |

-continued

PARTS LIST

| | |
|---|---|
| 500 | OLED |
| 510 | substrate |
| 520 | anode |
| 530 | hole-injection layer (HIL) |
| 540 | hole-transport layer (HTL) |
| 541 | hole-transport sublayer 1 |
| 542 | hole-transport sublayer 2 |
| 550 | emission layer (EML) |
| 560 | electron-transport layer (ETL) |
| 561 | electron-transport sublayer 1 |
| 562 | electron-transport sublayer 2 |
| 570 | cathode |

What is claimed is:

1. An organic light-emitting device comprising:
   a) a substrate;
   b) an anode and a cathode positioned relative to the substrate;
   c) an emission layer disposed between the anode and the cathode;
   d) a hole-transport layer disposed between the anode and the emission layer;
   e) an electron-transport layer disposed between the cathode and the emission layer;
   f) the hole-transport layer including one or more sublayers, the sublayer closest to the emission layer containing a first color-neutral dopant;
   g) the emission layer containing the first or another color neutral dopant; and
   h) the color-neutral dopant(s) including an anthracene derivative between 0.1 and 25 percent by volume of each layer or sublayer in which any of said color-neutral dopant(s) is present.

2. The device of claim 1 further including a hole-injection layer disposed between the anode and the hole-transport layer.

3. The device of claim 1 wherein the hole-transport layer includes two or more sublayers, the sublayer adjacent to the emission layer including the first, the second or the third color-neutral dopant.

4. The device of claim 1 wherein the sublayer of the hole-transport layer adjacent to the emission layer has a thickness in a range of 2 to 200 nm, and the sublayer closest to the anode has a thickness in the range of 2 to 200 nm.

5. The device of claim 1 wherein each sublayer of the hole-transport layer includes a tertiary aromatic amine.

6. The device of claim 1 wherein the color-neutral dopant(s) includes ADN or TBADN.

7. The device of claim 1 wherein the emission layer includes Alq, Gaq, Inq, or Mgq.

8. An organic light-emitting device comprising:
   a) a substrate;
   b) an anode and a cathode positioned relative to the substrate;
   c) an emission layer disposed between the anode and the cathode;
   d) a hole-transport layer disposed between the anode and the emission layer;
   e) an electron-transport layer disposed between the cathode and the emission layer;
   f) the emission layer containing a first color-neutral dopant;
   g) the electron-transport layer including one or more sublayers, the sublayer closest to the emission layer containing the first or another color-neutral dopant; and
   h) the color-neutral dopant(s) including an anthracene derivative between 0.1 and 25 percent by volume of each layer or sublayer in which any of said color-neutral dopant(s) is present.

9. The device of claim 8 further including a hole-injection layer disposed between the anode and the hole-transport layer.

10. The device of claim 8 wherein the sublayer of the electron-transport layer that is adjacent to the cathode does not contain the color-neutral dopant(s).

11. The device of claim 8 wherein the sublayer of the electron-transport layer closest to the cathode has a thickness in the range of 2 to 50 nm and the sublayer adjacent to the emission layer has a thickness in a range of 2 to 50 nm.

12. The device of claim 8 wherein the electron-transport layer includes Alq, Gaq, Inq, or Mgq.

13. The device of claim 8 wherein the emission layer includes Alq, Gaq, Inq, or Mgq.

14. The device of claim 8, wherein the color-neutral dopant(s) includes ADN or TRADN.

15. An organic light-emitting device comprising:
   a) a substrate;
   b) an anode and a cathode positioned relative to the substrate;
   c) an emission layer disposed between the anode and the cathode;
   d) a hole-transport layer disposed between the anode and the emission layer;
   e) an electron-transport layer disposed between the cathode and the emission layer;
   f) the emission layer containing a first color-neutral dopant;
   g) the electron-transport layer including one or more sublayers, the sublayer closest to the emission layer containing the first or a second color-neutral dopant;
   h) the hole-transport layer including one or more sublayers, the sublayer closest to the emission layer containing the first, the second or a third color-neutral dopant; and
   i) the color-neutral dopant(s) including anthracene derivatives.

16. The device of claim 15 further including a hole-injection layer disposed between the anode and the hole-transport layer.

17. The device of claim 15 wherein the hole-transport layer includes two or more sublayers, the sublayer adjacent to the emission layer including the first the second or the third color-neutral dopant.

18. The device of claim 15 wherein the sublayer of the hole-transport layer adjacent to the emission layer has a thickness in a range of 2 to 200 nm, and the sublayer closest to the anode has a thickness in the range of 2 to 200 nm.

19. The device of claim 15 wherein each sublayer of the hole-transport layer includes a tertiary aromatic amine.

20. The device of claim 15 wherein the color-neutral dopant(s) include ADN or TBADN.

21. The device of claim 15 wherein the emission layer includes Alq, Gaq, Inq, or Mgq.

22. The device of claim 15 wherein the electron-transport layer layer includes Alq, Gaq, Inq, or Mgq.

23. The device of claim 15 wherein the sublayer of the electron-transport layer that is closest to the cathode does not contain the color-neutral dopant(s).

24. The device of claim 15 wherein the sublayer of the electron-transport layer closest to the cathode has a thickness in the range of 2 to 50 nm and the sublayer closest to the emission layer has a thickness in a range of 2 to 50 nm.

25. The device of claim 15 wherein the color-neutral dopant(s) includes between 0.1 and 25 percent by volume of each layer or sublayer in which the color-neutral dopant(s) is present.

26. The device of claim 1 wherein the cathode is transparent.

27. The device of claim 8 wherein the cathode is transparent.

28. The device of claim 15 wherein the cathode is transparent.

* * * * *